United States Patent
Zhao et al.

(10) Patent No.: US 12,432,862 B1
(45) Date of Patent: Sep. 30, 2025

(54) FLEXIBLE LED VEHICLE-MOUNTED DISPLAY SCREEN AND PRODUCTION PROCESS THEREOF

(71) Applicant: Shenzhen Juntong technology Co., ltd, Shenzhen (CN)

(72) Inventors: Jun Zhao, Yibin (CN); Shun Yang, Chongqing (CN); Wei Cui, Neijiang (CN); Senlin Jian, Chaozhou (CN)

(73) Assignee: SHENZHEN JUNTONG TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/970,241

(22) Filed: Dec. 5, 2024

(30) Foreign Application Priority Data

Sep. 3, 2024 (CN) .......................... 202411228977.9

(51) Int. Cl.
*H05K 3/30* (2006.01)
*B60R 11/02* (2006.01)
*H05K 3/36* (2006.01)

(52) U.S. Cl.
CPC .......... *H05K 3/305* (2013.01); *B60R 11/0235* (2013.01); *H05K 3/365* (2013.01);
(Continued)

(58) Field of Classification Search
CPC ................... H05K 3/305; H05K 3/365; H05K 2201/10098; H05K 2201/10106; H05K 2203/085; H05K 2203/104; H05K 2203/107; H05K 1/189; B60R 11/0235; H10H 29/142; H10H 29/0362; H10H 29/852; H10H 20/0362; H10H 20/852;
(Continued)

(56) References Cited

U.S. PATENT DOCUMENTS

2017/0334114 A1* 11/2017 Sticklus .................. F21V 31/04
2023/0232541 A1* 7/2023 Zhao ...................... H05K 1/181
156/329

FOREIGN PATENT DOCUMENTS

CN 106195742 A 12/2016
CN 205881367 U * 1/2017
(Continued)

OTHER PUBLICATIONS

Machine translation of CN 106195742 date unknown.*
Machine translation of CN 205881367 date unknown.*

*Primary Examiner* — John L Goff, II
(74) *Attorney, Agent, or Firm* — Ming Jiang; OPENPTO US LLC (57) ABSTRACT

The present invention provides a flexible LED vehicle-mounted display screen and a production process thereof. The production process includes the following steps: adopting an FPC as a basic material of the display screen main body, fixing the flexible screen on a mold, mixing a PU glue, degassing treatment, glue dripping, automatic degassing, curing, and collecting. The flexible screen is fixed on a mold tray by magnetic suction or vacuum, and an air pressure sensor, a camera, a solenoid valve and the like are used to intelligently process the glue dripping and degassing processes. A plurality of Bluetooth BLE is installed on an FPC for communication, an MCU with a DMA function is adopted, and data are compressed to 50% of original data by an LZSS coding algorithm, which greatly reduces the time for the flexible screen to send data and improves the user experience.

5 Claims, 5 Drawing Sheets

(52) U.S. Cl.
CPC .............. *H05K 2201/10098* (2013.01); *H05K 2201/10106* (2013.01); *H05K 2203/085* (2013.01); *H05K 2203/104* (2013.01); *H05K 2203/107* (2013.01)

(58) Field of Classification Search
CPC .. H01L 25/0753; B32B 37/003; B29C 66/342
USPC ....................................................... 156/286
See application file for complete search history.

(56) References Cited

FOREIGN PATENT DOCUMENTS

| | | | |
|---|---|---|---|
| CN | 114333652 A | 4/2022 | |
| CN | 116647979 A | 8/2023 | |

\* cited by examiner

FLEXIBLE LED VEHICLE-MOUNTED DISPLAY SCREEN AND PRODUCTION PROCESS THEREOF

CROSS-REFERENCE TO RELATED APPLICATIONS

The application claims priority to Chinese patent application No. 2024112289779, filed on Sep. 3, 2024, the entire contents of which are incorporated herein by reference.

TECHNICAL FIELD

The present invention relates to the technical field of vehicle-mounted display screens, and in particular, to a flexible LED vehicle-mounted display screen and a production process thereof.

BACKGROUND

The most common vehicle-mounted display screens are those on buses and taxis, which are all made of rigid materials. These display screens are not only heavy but also very inconvenient to install, and can only be used for advertising in some special means of transportation, which belongs to an engineering project installation rather than a civilian consumer product. To solve the defects of rigid screens, some enterprises propose preparing a flexible LED display screen by a flexible material of a flexible printed circuit (FPC), provide controlling and changing the content of a display screen by a mobile phone APP and achieving fast switching by using a remote controller, and also provide covering a layer of silica gel or a PET film on a surface of a display screen to achieve a certain waterproof effect. However, these products have not been widely used in the civilian consumer market. It can be seen from careful analysis of these design solutions that these products basically achieve a flexible LED screen by only combining some existing technologies, which does not really understand specific requirements of civilian consumers for an LED flexible display in the vehicle-mounted field. Therefore, it is natural that the products are not accepted by the majority of consumer markets. The requirements for an LED flexible screen in the civilian vehicle-mounted field are analyzed as follows:

1. Light, thin and bendable: Automobile glass has a certain curvature, and the bendable flexible screen can be seamlessly adhered to the glass, which has the advantages of no light leakage and light weight.

2. Convenient installation: It is impossible for ordinary consumers to use too many installation tools, such as drilling holes in a vehicle to install brackets and using glass glue. The most convenient and fast installation method for ordinary consumers is adhering, which does not require the use of any other auxiliary materials (such as double-sided adhesive tape), similar to glass film adhering.

The PU glue dripping process is performed on the main surface of the display screen to enable the waterproof level to reach IP65 or above; and due to the characteristics of the surface PU glue, the PU glue can be firmly adhered to the glass without any auxiliary materials, which can meet the requirements of consumers. A glue dripping process is a common method, for example, it is applied to the production of LED flexible light strips. Specifically, FPC is adhered to a specific mold bracket by using double-sided adhesive tape, leaving an edge of the FPC suspended, and then the mixed glue is dripped on the FPC through a glue dripping machine.

However, the flexible screen belongs to a display screen and is formed by a large number of LED dot matrixes. For example, a P5 dot matrix has 40,000 lamps per square meter (P5 means 5 mm of lamp bead distance, the length and width of one meter means 200 LED lamp beads in length and width, and one square meter has 200×200=40,000 LED lamp beads), each lamp bead is provided with 4 pad pins (V+, R, G, and B), which is equivalent to 120,000 circuits. Such a complex circuit causes two problems when applied to a flexible display screen using this conventional technology:

1) After the glue dripping by adhering with a double-sided adhesive tape is completed, operators need to pull a flexible screen hard when the flexible screen is collected, which is more likely to cause damage to the circuit. Certainly, the double-sided adhesive tape is used for adhering in the industry. As double-sided tape is a consumable, the cost of mass production is also considerable.

2) After glue is dripped to a surface of a lamp bead, the glue flows into gaps formed at a bottom of the lamp bead to form bubbles. Due to the poor fluidity of PU glue and individual differences in lamp beads, the time for bubble discharge is uncertain, ranging from a few minutes to dozens of minutes. Some bubbles are just discharged, but PU glue on the surface layer is solidified. In actual operation, 50% of the bubbles are discharged naturally, 20% of the bubbles are beside the lamp bead pins, 20% of the bubbles do not burst on the surface, and 10% of the bubbles burst above the lamp beads or on the surface, which greatly affects the appearance. Even the bubbles above the lamp beads affect the light transmittance.

3. Product appearance: As mentioned above, the surface of most flexible screens adopts the glue dripping process. Surface bubbles are the pain point of the industry, and the number of bubbles is different for almost every product, with more and less. Consumers are unwilling to buy defective products, but rather want the best product with the least bubbles. The requirement on the product appearance consistency is very high, and the complete removal of the bubbles formed by glue dripping is very important.

A better method is a vacuum-pumping bubble-removing method, but it is difficult for the industry to achieve vacuum removal of bubbles for products without grooves on the surface or baffles on the edges. During the vacuum pumping process, tiny bubbles also expand to a large size, and countless bubbles expand like laundry detergent bubbles because there is no baffle around the flexible screen. When expanding to a certain extent, these bubbles burst and overflow to the edge of the flexible screen, ultimately wasting all the previous efforts.

4. Tensile resistance: A flexible display screen is different from a rigid screen, and the rigid screen has no secondary stress damage after leaving a factory. Civilian consumer flexible screens are also different from conventional engineering flexible screens. Since ordinary people have low awareness of the products and lack professional installation knowledge, during the installation and use process, the flexible screens are inevitably bent many times or adhered crookedly, or may be pulled off and adhered again. Therefore, a very high tensile resistance is required.

5. User experience: The main market for existing LED advertising screens (whether rigid or flexible) is the engineering installation, with installation and usage guidance provided by a professional team, but consumer flexible screens are different. Common consumers often show a fleeting interest in consumer products. Products must be easy to use and meet the basic requirements of consumers quickly, because almost no consumer reads the entire manual carefully before using the product (just like when consumers buy a vehicle, the consumer never reads all the manuals before driving, starts the vehicle when getting on the vehicle, and slowly studies various functions of the vehicle after driving). Detailed manuals are only used as dictionaries. Quick start and good user experience are crucial for consumer products.

Conventional flexible display screens use ordinary Bluetooth/WIFI as a wireless communication protocol. The WIFI transmission speed is fast, but the experience is poor (Because after a mobile phone is connected to a flexible screen via WIFI, the flexible screen is not connected to the Internet, resulting in no network on the mobile phone, and the user will be crazy. Most mobile phones will automatically switch to WIFI hotspots without the Internet. Once the WIFI hotspots are switched, the mobile phones are disconnected from the flexible screen, resulting in unsuccessful data transmission). The ordinary Bluetooth has a fast connection speed, but slow data transmission, which may take several minutes to send a piece of animation data, and the experience is not good. Therefore, the key is to solve the problem of no WIFI network or increase the Bluetooth sending speed.

6. High and Low Temperature Resistance:

The vehicle is used outdoors and is exposed to the sun and rain, and the temperature inside the vehicle is below −15° C. in winter and over 70° C. in summer. The temperature resistance of the vehicle-mounted product is very high. In addition, due to the strong ultraviolet rays from sunlight, it is necessary to resist damage of ultraviolet rays to product materials.

7. Static Electricity and Surge:

The vehicle rubs against the air in the driving process to form strong static electricity. Gasoline vehicle generators and electric vehicle motors generate large surge currents in electronic circuits. Therefore, the vehicle-mounted electronic products must withstand the hazards of high static electricity and high surges.

In view of this, a flexible LED vehicle-mounted display screen and a production process thereof are provided to solve the problems.

SUMMARY

The present invention aims to provide a novel flexible LED vehicle-mounted display screen and a production process thereof, wherein the display screen can better meet the requirements of modern vehicle interior design and has better plasticity, durability and display effect.

The present invention provides a production process of a flexible LED vehicle-mounted display screen, which includes the following steps:

S1. adopting an FPC as a basic material of a display screen main body to improve a tensile resistance, and mounting an LED lamp bead, an MCU and a drive IC on the FPC to form a flexible screen;

S2. fixing the flexible screen in a vacuum box through a mold;

S21. if a bracket of the LED lamp beads is made of a magnetic material, such as iron, embedding a magnet strip into a mold tray, and fixing the flexible screen on the mold by attraction of a magnet to the magnetic material;

S22. if a bracket of the LED lamp bead is made of a non-magnetic material, adopting a hollow mold tray, covering a layer of silica gel sheet right above the mold tray, punching a certain number of holes on the silica gel sheet at equal intervals, and sealing the silica gel sheet and a mold edge by using glue; after the flexible screen is placed on the mold tray, extracting air inside the mold tray, and adsorbing the flexible screen on the mold tray by negative pressure;

S3. PU glue mixing: accurately weighing a component A and a component B, and uniformly mixing to obtain the PU glue;

S4. degassing treatment: placing the mixed PU glue in a vacuum for degassing treatment to remove bubbles generated during the stirring process;

S5. first-time glue dripping: dripping the degassed PU glue on the lamp bead of the flexible screen in the vacuum box, covering a bottom of the lamp bead and waiting for solidification;

S6. detecting an air pressure of the vacuum box in real time by adopting an air pressure sensor, photographing and analyzing the expansion of the bubbles with a camera, feeding the air pressure back to an electronic system MCU, and keeping the vacuum degree in the vacuum box stable by controlling a solenoid valve so as to ensure that the bubbles stably expand at a preset height;

S7. filling a surface by performing second-time glue dripping, and leaving the PU glue naturally cured or cured by a UV light;

S8. collecting: for the step S21, directly taking off the cured flexible screen; and for the step S22, after the glue is dripped, opening an exhaust hole so as to release the vacuum and remove the flexible screen by an operator.

In the step S3, the component A is polyester polyol or polyether polyol, the component B is isocyanate, and the components A and B are mixed in a ratio of 1:1 to prepare the PU glue.

Further, the FPC includes a bottom coating, a bottom copper foil circuit, an intermediate substrate layer, a top copper foil circuit, and a top coating stacked in sequence. The bottom coating and the top coating have openings to expose the copper foil circuit, which is connected to a device pad through tin to achieve an electrical connection. The pads of the bottom copper foil circuit and the top copper foil circuit are special-shaped asymmetric pads with a copper foil area greater than an opening area of the coating, which aims to enable the coating to press a periphery of the pads to prevent the pad circuit from being damaged in bending.

More preferably, the LED lamp bead, the MCU and the drive IC are all placed on the same side of the FPC; and a reinforcing sheet is adhered to the bottom of the MCU and the drive IC, and a plurality of ventilation holes are formed in the reinforcing piece.

More preferably, the PU glue material is added with an anti-UV agent, wollastonite, talcum powder, mica and the like, so that better temperature resistance and ultraviolet resistance can be obtained.

More preferably, to withstand the hazards of high static electricity and high surges, the MCU and the drive IC are wrapped with a ground network.

For the further description of the foregoing solution, in the step S6, the solenoid valve and the vacuum machine are opened by the electronic system to pump the air pressure in the vacuum box to a set value of −25 kpa. When the camera captures the bursting of large bubbles, the electronic system reduces the air pressure to −50 kpa, and maintains the air pressure for 3-8 seconds. If the camera captures the bubbles expanding too high, the electronic system controls the air valve to let in air to increase the air pressure and prevent glue overflow. Finally, the electronic air valve is fully opened to allow the vacuum pump to pump out the remaining air and remove tiny bubbles.

The present invention further provides a flexible LED vehicle-mounted display screen. The display screen adopts the foregoing production process, and a plurality of Bluetooth BLE is installed on the FPC for communication, so that a plurality of processes for receiving data are virtualized; and the display screen adopts an MCU with a DMA function, data can be directly stored or forwarded to a UART (serial port) without being processed by the MCU, and therefore the data can accurately reach the flexible screen for display. The display screen also adopts an LZSS coding algorithm to compress the data to 50% of the original data, so that the transmission time is reduced, and the user experience is greatly improved.

Compared with the prior art, the flexible LED display screen provided by the present invention can be easily adapted to various complex curved surfaces inside a vehicle, so that the flexibility and the attractiveness of the display screen in the interior design are improved;
improved durability: by adopting a special flexible material as a substrate and optimizing component layout, circuit design and pads, the display can maintain good performance and long service life even under frequent bending; and
simplified production process: when the flexible screen is mounted on a mold, a double-sided adhesive tape is no longer required, magnetic suction or negative pressure design is adopted to save costs, reduce labor and reduce the tensility of the flexible screen; and intelligent control is adopted to effectively prevent glue overflow, glue shortage and bubbles.

The present invention not only improves the performance and durability of the display screen, but also simplifies the production process and reduces the cost. It is suitable for a wide range of vehicle interior application scenarios and has high practical value and market prospects.

BRIEF DESCRIPTION OF DRAWINGS

To describe the technical solutions in embodiments of the present invention more clearly, the following briefly describes the accompanying drawings required for describing the embodiments. Apparently, the accompanying drawings in the following description show some embodiments of the present invention, and those of ordinary skill in the art may still derive other drawings from these accompanying drawings without creative efforts.

Reference numerals in the drawings are as follows:
1: mold tray; 11: magnet strip; 2: FPC; 21: component area; 3: lamp bead area; 4: special-shaped pad; and 5: coating hole.

The above accompanying drawings have shown specific embodiments of the present invention, which will be described in more detail below. The accompanying drawings and descriptions are not intended to limit the scope of the inventive concepts in any manner, but rather to illustrate the inventive concepts to those skilled in the art by reference to specific embodiments.

DETAILED DESCRIPTION OF THE EMBODIMENTS

The following clearly and completely describes the technical solutions in embodiments of the present invention with reference to the accompanying drawings in embodiments of the present invention. Apparently, the described embodiments are merely some rather than all of embodiments of the present invention. Based on the embodiments of the present invention, all other embodiments obtained by those of ordinary skill in the art without creative effort fall within the protection scope of the present invention.

To make the objectives, technical solutions, and advantages of the present invention clearer, the following further describes the implementations of the present invention in detail with reference to the accompanying drawings.

Figure 1:
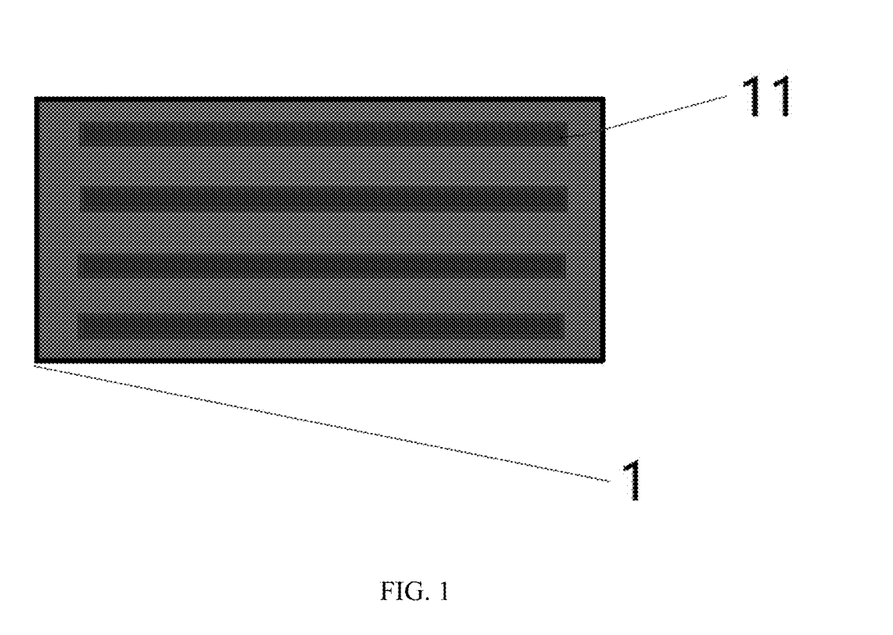
FIG. 1 is a schematic diagram of a magnet mold according to an embodiment of the present invention.
Figure 2:
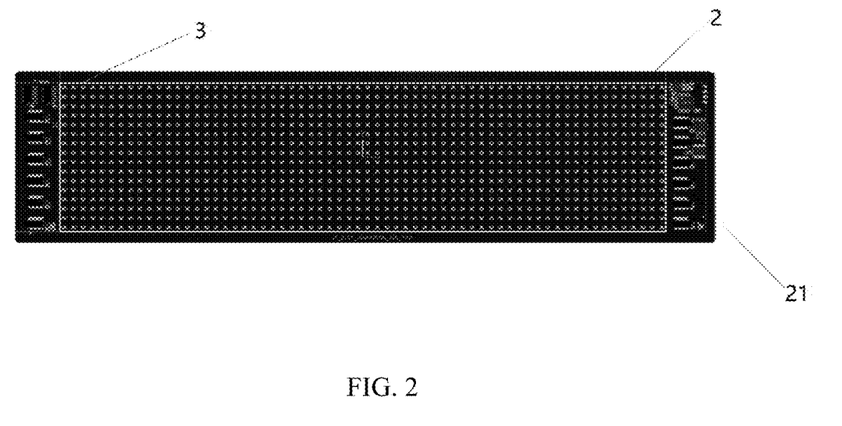
FIG. 2 is a schematic diagram of a glue dripping area of a display screen according to an embodiment of the present invention.
Figure 3:
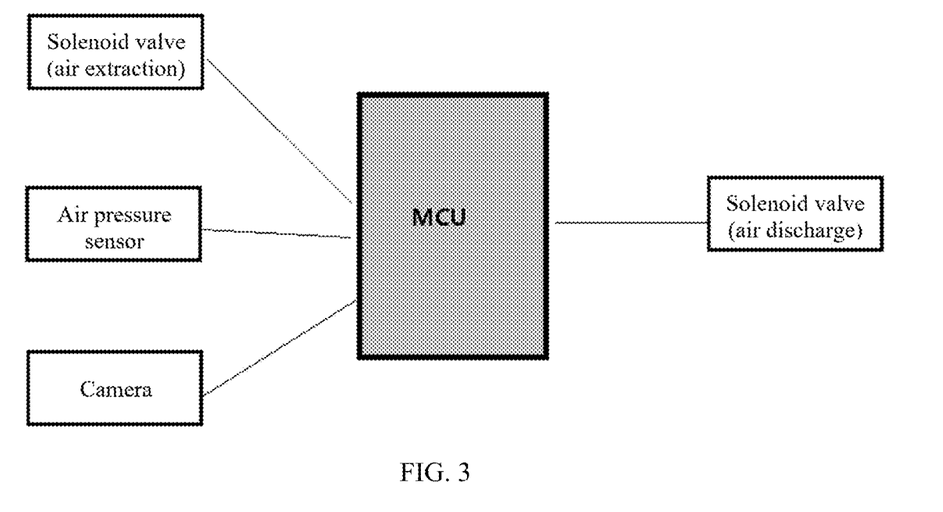
FIG. 3 is a schematic diagram of an electronic closed-loop system according to an embodiment of the present invention.

Referring to FIGS. 1 to 5, the present invention provides a production process of a flexible LED vehicle-mounted display screen, which includes the following steps:
S1. FPC2 is used as a basic material of a display screen main body, the FPC2 is integrated with a bracket of the LED lamp beads to improve the tensile resistance, and an LED lamp bead, an MCU and a drive IC are adhered to the FPC2 to form a flexible screen. In this embodiment, the components such as the LED lamp bead, the MCU, and the driver IC are placed on the same side of the FPC2, as shown in FIG. 2, a component area 21 is positioned at two sides of the lamp bead area 3, and thus, no matter which side the display screen is bent, the components are not easily damaged. A reinforcing sheet is also adhered to a bottom of the MCU and the drive IC, so that even when the flexible screen is bent, the bending degree is greatly reduced with the reinforcing sheet, and the probability of circuit breakage is reduced. A plurality of ventilation holes are formed in the reinforcing sheet. During the heating process of the patch production, the reinforcing sheet heats up quickly and the expanded air is dissipated through the ventilation holes, which effectively prevents the circuit board from bulging or falling off.
S2. The flexible screen is fixed in a vacuum box through a mold. According to the prior art, the flexible screen is fixed on a mold through a double-sided adhesive tape, so that the cost of the double-sided adhesive tape is increased, and an operator needs to pull the flexible screen forcefully after the glue is dripped; consequently, the circuit is easily damaged. The present invention adopts a new technical solution as follows:
S21. if a bracket of the LED lamp beads is made of a magnetic material, such as iron, as shown in FIG. 1, embedding a magnet strip 11 into a mold tray 1, and fixing the flexible screen on the mold by attraction of a magnet to the magnetic material; and
S22. if a bracket of the LED lamp bead is made of a non-magnetic material, adopting a hollow mold tray 1, covering a layer of silica gel sheet right above the mold tray 1, punching a certain number of holes on the silica gel sheet at equal intervals, and sealing the silica gel sheet and a mold edge by using glue; after the flexible screen is placed on the mold tray 1, extracting air inside the mold tray 1, and adsorbing the flexible screen on the mold tray 1 by negative pressure.

S3. PU glue mixing. A component A and a component B are accurately weighed and uniformly mixed to obtain the PU glue; and the PU glue material is added with an anti-UV agent, wollastonite, talcum powder, mica and the like, so that better temperature resistance and ultraviolet resistance can be obtained.

S4. degassing treatment: the mixed PU glue is placed in a vacuum for degassing treatment to remove bubbles generated during the stirring process.

S5. first-time glue dripping. The degassed PU glue is dripped on the lamp bead of the flexible screen in the vacuum box, a bottom of the lamp bead is covered for solidification. As shown in FIG. 2, a part of the glue is dripped on the lamp bead to just cover the bottom of the lamp bead (different beads have different heights, and the pins also have different heights. For 2121 lamp beads, the entire thickness of the lamp beads is 1.0 mm, and the optimal effect is achieved when the thickness is 0.3 mm to 0.5 mm. For 3528 lamp beads, the height of the lamp beads is 1.9 mm, and the optimal effect is achieved when the thickness is 0.5 mm to 0.8 mm). There is no glue dripping around the edge of the lamp bead area 3. As shown in FIG. 2, there is no glue dripping around the edge. The glue overflow can be generated due to expansion of bubbles during next step of vacuum pumping, and in this case, due to the small amount of glue, there is no glue on the edge temporarily. Even if there is glue overflow, the glue is controlled and is not easy to flow to the edge and overflow.

S6. an air pressure of the vacuum box is detected in real time by adopting an air pressure sensor, the expansion of the bubbles is photographed and analyzed with a camera, the air pressure is fed back to an electronic system MCU, and the vacuum degree in the vacuum box is kept stable by controlling a solenoid valve so as to ensure that the bubbles stably expand at a preset height. Through actual verification, the relationship between bubble diameter (mm) and air pressure (kpa) is shown in Table 1.

The specific operation steps are as follows:

Firstly, a solenoid valve and a vacuum machine are opened by an electronic system, and an air pressure in a vacuum box is pumped to a set value of −25 kpa. In this case, the bubbles start to expand, and the bubbles with high air pressure burst in a few seconds. Since the air pressure is not further reduced, the expansion height of the bubbles is very low, so that the glue hardly overflows to a board edge of the flexible screen and does not flow out. After the large bubbles burst, the electronic system reduces the air pressure to −50 kpa and maintains the air pressure for 3-8 seconds; the small bubbles are changed into large bubbles and burst, the expansion height is still controllable, and glue does not overflow; and finally, an electronic air valve is completely opened, the residual air is pumped out by the vacuum pump, the tiny bubbles can be removed, with a removal rate of 100%. A sensor is used to detect whether the air pressure value is matched with a set value or not in the whole process, and the camera analyzes and finds whether the bubbles expand too high or not, causing a risk of glue overflow. If the bubble expands too high, there may be a risk of glue overflow. The electronic system controls another air valve to let in a little air, which increases the air pressure, and reduces the expansion height of the bubbles, thereby preventing glue overflow. The vacuum operation to remove bubbles is completed within 60 seconds, and the PU glue is not solidified. Finally, the product with bubbles removed is taken out, and more glue is added to fill the missing glue parts on the edge of the product and cover the lamp bead of the product.

S7. a surface is filled by performing second-time glue dripping, and the PU glue is naturally cured or cured by a UV light.

S8. collecting: for the step S21, the cured flexible screen is directly taken out; and for the step S22, after the glue is dripped, an operator opens an exhaust hole so as to release the vacuum and remove the flexible screen.

In the step S3, the component A is polyester polyol or polyether polyol, the component B is isocyanate, and the components A and B are mixed in a ratio of 1:1 to prepare the PU glue.

Further, the FPC2 includes a bottom coating, a bottom copper foil circuit, an intermediate substrate layer, a top copper foil circuit, and a top coating stacked in sequence.

TABLE 1

| Bubble type | −25 kpa | −50 kpa | −75 kpa | −100 kpa |
|---|---|---|---|---|
| Bubbles in the gap at the bottom of the lamp bead | 3-5 mm | 5-10 mm | >10 mm | Quick burst and glue splashing |
| Bubbles in the glue dripping process | <3 mm | 3-5 mm | 5-10 mm | A few bubbles burst, and tiny bubbles can be seen with the naked eye after the vacuum is released |
| Bubbles in the glue | <1 mm | <3 mm | 3-5 mm | Bubbles are present but do not burst, and after the vacuum is released, the bubbles are invisible to the naked eye |

According to the experimental data in the above table, it can be seen that a better vacuum air pressure value is selected based on a size of a lamp bead-free area 3 at the edge of the flexible screen. The lamp bead-free area 3 at the edge of the flexible screen is usually 8 mm, and the bubble diameter is selected within 3 mm to 5 mm, which can ensure that there is no glue overflow and the bubbles can be removed quickly.

The bottom coating and the top coating have openings to expose the copper foil circuit, which is connected to a device pad through tin to achieve an electrical connection. The pads of the bottom copper foil circuit and the top copper foil circuit are special-shaped asymmetric pads, as shown in FIG. 4.

The FPC2 double-sided circuit board can be roughly divided into a bottom coating, a bottom copper foil circuit, an intermediate substrate layer, a top copper foil circuit, and a top coating. The wiring is exposed opening holes in the coating layer, so that the wiring can be connected to a device pad through tin, and the connection of an electrical connection is achieved. The traditional design method is to make the opening size of the coating layer slightly greater than the pad of the circuit layer. According to this conventional method, after the later-stage patch processing, the pad is filled with tin. Since the tin is high in hardness and is in a liquid state when being heated and melted, the liquid tin has surface tension, which makes the tin thin around the edges and thick in the middle. The thin part around is just like a knife. When the flexible screen is bent, the "knife" cuts the circuit, or even cuts the middle substrate. Since this is the junction between soft and hard, this part is prone to dead folds and the pads can be easily pulled off by the device.

Figure 4:
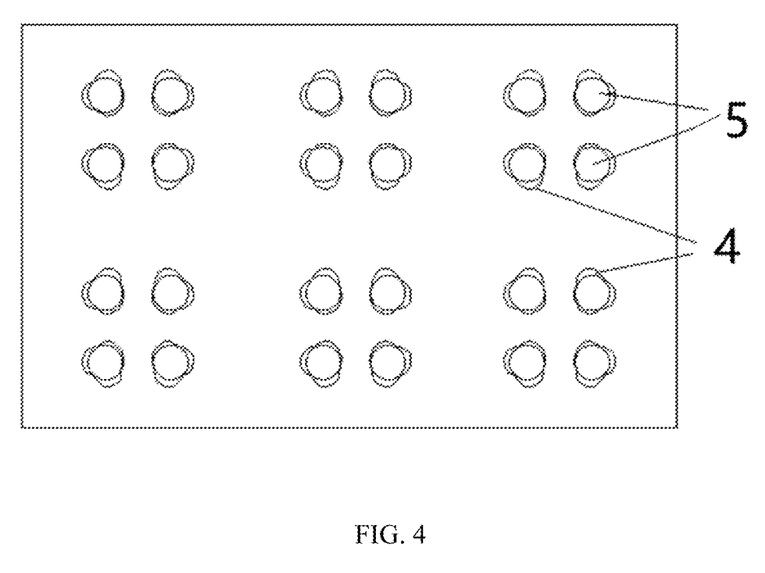
FIG. 4 is a schematic diagram of a pad and a via according to an embodiment of the present invention.
Figure 5:
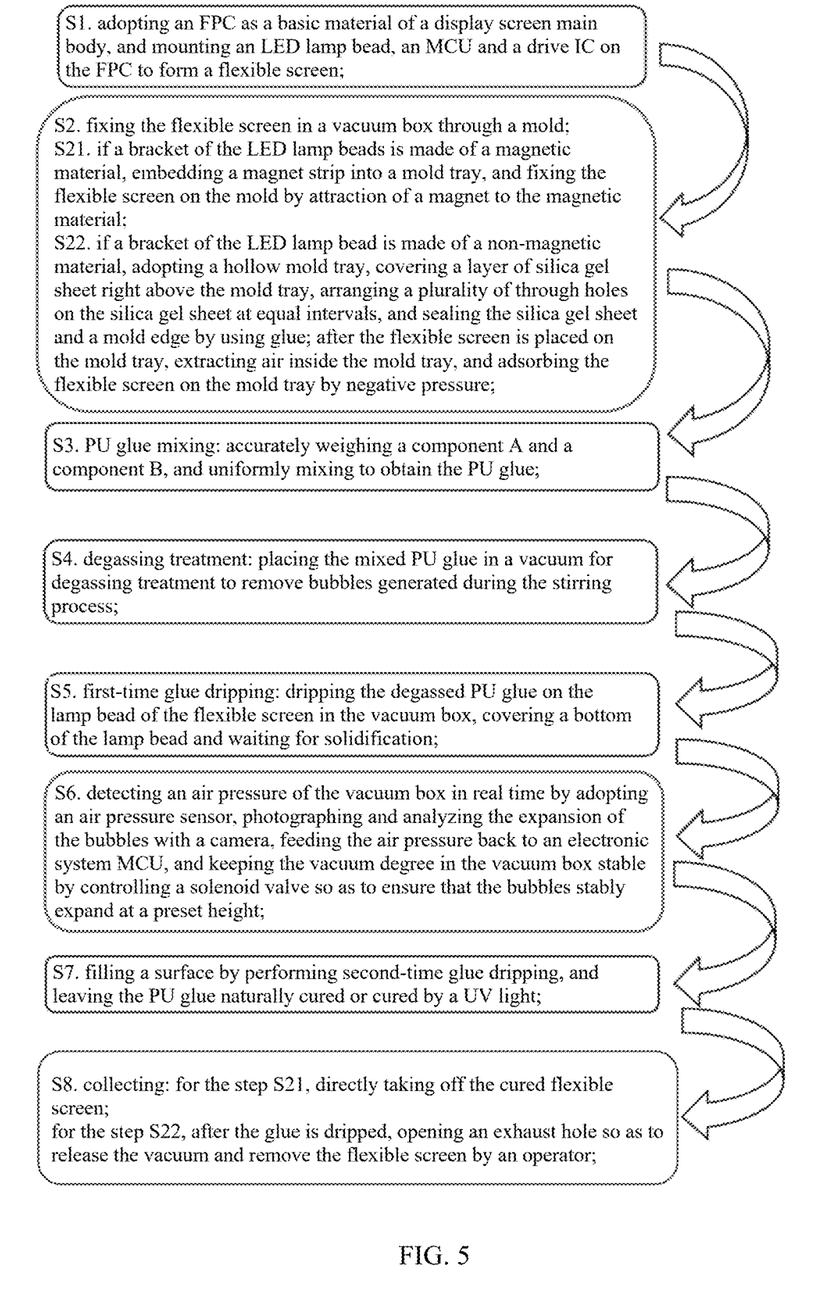
FIG. 5 is a schematic diagram of a process flow diagram according to an embodiment of the present invention.

To avoid this phenomenon, the copper foil of the pad is enlarged, or the pad is designed into a special-shaped pad 4 without affecting other wirings, such as a thermal pad and an asymmetric pad, as shown in FIG. 4. A size of a coating hole 5 on the surface is kept unchanged, so that the entire coating can completely cover the periphery of the pad and press the periphery of the pad. When the patch is processed later in the covered area, the tin cannot fill the entire pad, so that the circuit is not cut or the circuit board is not cut through. If the copper foil of the circuit layer is thick enough, 100% of circuits can be completely prevented from being cut off, and the pads cannot fall off. Since there is copper foil as a buffer at the junction of soft and hard, there is no dead fold, which greatly reduces the probability of the pad falling off.

The tensile resistance of the flexible screen can be improved by designing a hardware circuit of the flexible screen, designing a device pad, and layouting and reinforcing a device. After actual testing, it is found that 98% of the finished flexible screens designed using this solution can withstand a force of 10 kg without being damaged when bent 90 degrees, and more than 90% of the products can withstand a force of 20 kg without being damaged. Table 2 is a data table of 200 products tested:

TABLE 2

| Force (kg) | 1 kg | 5 kg | 10 kg | 15 kg | 20 kg |
|---|---|---|---|---|---|
| Force on lamp bead | 200 | 200 | 199 | 191 | 183 |
| Good product ratio | 100% | 100% | 99.5% | 95.5% | 91.5% |
| Force on chip | 200 | 199 | 196 | 185 | 179 |
| Yield ratio | 100% | 99.5% | 98% | 92.5% | 89.5% |

It can be seen from analysis that the chip is more susceptible to damage than the lamp bead due to larger size and more concentrated force.

To withstand the hazards of high static electricity and high surge, TVS and ESD devices are placed at the product interface to prevent surge and static electricity from damaging the product. When the circuit is designed, MCU, driver IC chips and other devices are wrapped with a ground network to make it easier for static electricity/surge current to reach the ground network, reducing the probability of damage.

The present invention further provides a flexible LED vehicle-mounted display screen. The display screen adopts the foregoing production process, and a plurality of Bluetooth BLE is installed on the FPC2 for communication, so that a plurality of processes for receiving data are virtualized; and the display screen adopts an MCU with a DMA function, data can be directly stored or forwarded to a UART (serial port) without being processed by the MCU, and therefore the data can accurately reach the flexible screen for display. The display screen also adopts an LZSS coding algorithm to compress the data to 50% of the original data, so that the transmission time is reduced, and the user experience is greatly improved.

The Bluetooth BLE is used as a communication protocol between a mobile phone and a flexible screen, so that the mobile phone is disconnected from the network when the user connects to the flexible screen. The Bluetooth transceiving process is increased, and the data compression algorithm is introduced to reduce data volume, thereby increasing the data transmission speed, controlling the content data sending time within 10 seconds, and improving the user experience. The specific implementation is as follows:

1) Although the single transmission rate of Bluetooth BLE is slow, a mobile phone can connect to multiple Bluetooth devices at the same time. Then a plurality of processes for receiving data are virtualized by optimizing the software of the Bluetooth receiving device. For example, if there are 8 processes for receiving data, the transmission rate can theoretically increase by 8 times. In practical application, the transmission rate can be improved by about 6 times.

2) Factors that affect the transmission rate include data storage speed and data forwarding speed. The Bluetooth chip receives the data immediately and quickly. Since a memory (RAM) of an embedded MCU (microprocessor) is generally not high and the main frequency is not high, most of the chips of an M3 (a commonly used chip architecture) core do not exceed 100 M (such as STM32f103), and cannot quickly receive and forward the whole data packet. Therefore, an MCU (whether a Bluetooth chip or a main driver chip) having a DMA (direct memory access) function is used. The data can be directly stored or forwarded to a UART (serial port) without being processed by the MCU, thereby ensuring that the data accelerated in 1) above can accurately reach the flexible screen for display.

3) To further improve the transmission rate, the data is compressed, an LZSS coding algorithm is adopted to compress the data to 50% of the original data, which is equivalent to doubling the data transmission rate. Previously, it takes 1 minute to transmit a piece of image data, but now it takes less than 5 seconds, greatly improving the user experience.

4) Data packet verification is used to generate a flag word (CRC verification is used in actual applications to generate 4 bytes of data, about 430 million pieces of different data). Then, by combining with the underlying program of the flexible screen, historical data of a user is cached. By comparing the flag word with data before the data is sent every time, it is determined whether the data is new data. If it is historical data, the data does not need to be sent and can be directly called out, achieving "0" data transmission time. The user experience is improved rapidly.

In conclusion, the flexible LED display screen provided by the present invention can be easily adapted to various complex curved surfaces inside a vehicle, so that the flexibility and the attractiveness of the display screen in the interior design are improved; by adopting a special flexible material as a substrate and optimally designing the layout of components, the display screen can keep good performance and long service life even under frequent bending; when the flexible screen is mounted on a mold, a double-sided adhesive tape is no longer required, magnetic suction or negative pressure design is adopted to save costs, reduce labor and reduce the tensility of the flexible screen; and intelligent control is adopted to effectively prevent glue overflow, glue shortage and bubbles.

The present invention not only improves the performance and durability of the display screen, but also simplifies the production process and reduces the cost. It is suitable for a wide range of vehicle interior application scenarios and has high practical value and market prospects.

Other embodiments of the present invention will be apparent to those skilled in the art based on the specification and practice of the present invention. The present invention is intended to cover any variations, uses or adaptive changes of the present invention that follow the general principles of the present invention and comprise common general knowledge and conventional technical means that are within the art to which the present invention pertains and are not disclosed in the present invention. The specification and embodiments shall be considered as exemplary only, with a true scope and spirit of the present invention being indicated by the following claims.

It should be understood that the present invention is not limited to the precise arrangements that have been described above and shown in the drawings, and that various modifications and changes can be made without departing from the scope of the present invention. The scope of the present invention is limited only by the appended claims.

What is claimed is:

1. A production process of a flexible light-emitting diode (LED) vehicle-mounted display screen, comprising the following steps:
   S1. adopting a flexible printed circuit (FPC) as a basic material of a display screen main body, and mounting an LED lamp bead, a microcontroller unit (MCU) and a drive integrated circuit (IC) on the FPC to form a flexible screen;
   S2. fixing the flexible screen in a vacuum box through a mold;
   S21. if a bracket of the LED lamp bead is made of a magnetic material, embedding a magnet strip into a mold tray, and fixing the flexible screen on the mold tray by attraction of a magnet to the magnetic material;
   S22. if a bracket of the LED lamp bead is made of a non-magnetic material, adopting a hollow mold tray, covering a layer of silica gel sheet right above the mold tray, arranging a plurality of through holes on the silica gel sheet at equal intervals, and sealing the silica gel sheet and a mold edge by using glue; after the flexible screen is placed on the mold tray, extracting air inside the mold tray, and adsorbing the flexible screen on the mold tray by negative pressure;
   S3. polyurethane (PU) glue mixing: accurately weighing a component A and a component B, and uniformly mixing to obtain the PU glue;
   S4. degassing treatment: placing the mixed PU glue in a vacuum for degassing treatment to remove bubbles generated during the mixing process;
   S5. first-time glue dripping: dripping the degassed PU glue on the lamp bead of the flexible screen in the vacuum box, covering a bottom of the lamp bead and waiting for solidification;
   S6. detecting an air pressure of the vacuum box in real time by adopting an air pressure sensor, photographing and analyzing expansion of bubbles with a camera, feeding the air pressure back to an electronic system MCU, and keeping the vacuum degree in the vacuum box stable by controlling a solenoid valve so as to ensure that the bubbles stably expand at a preset height;
   S7. filling a surface by performing second-time glue dripping, and leaving the PU glue naturally cured or cured by a ultraviolet (UV) light;
   S8. collecting: for the step S21, directly taking off the cured flexible screen; and
   for the step S22, after the glue is dripped, opening an exhaust hole so as to release the vacuum and remove the flexible screen by an operator;
   wherein in the step S3, the component A is polyester polyol or polyether polyol, the component B is isocyanate, and the components A and B are mixed in a ratio of 1:1 to prepare the PU glue;
   the FPC comprises a bottom coating, a bottom copper foil circuit, an intermediate substrate layer, a top copper foil circuit, and a top coating stacked in sequence, the bottom coating and the top coating have openings to expose the copper foil circuit, which is connected to a device pad through tin to achieve an electrical connection;
   for the step S6, a solenoid valve and a vacuum pump are opened by an electronic system to pump an air pressure in the vacuum box to a set val of −25 kpa, when the camera captures bursting of large bubbles, the electronic system reduces the air pressure to −50 kpa and maintains the air pressure for 3-8 seconds, if the camera captures the bubbles expanding more than the preset height, the electronic system controls an air valve to let in air to increase the air pressure and prevent glue overflow, and finally, the solenoid valve is fully opened to allow the vacuum pump to pump out remaining air and remove tiny bubbles.

2. The production process of a flexible LED vehicle-mounted display screen according to claim 1, wherein pads of the bottom copper foil circuit and the top copper foil circuit are special-shaped asymmetric pads with a copper foil area greater than an opening area of the coating.

3. The production process of a flexible LED vehicle-mounted display screen according to claim 1, wherein the LED lamp bead, the MCU and the drive IC are all placed on the same side of the FPC; and a reinforcing sheet is adhered to a bottom of the MCU and the drive IC, and a plurality of ventilation holes are formed in the reinforcing sheet.

4. The production process of a flexible LED vehicle-mounted display screen according to claim 1, wherein the PU glue material is added with an anti-UV agent and wollastonite.

5. The production process of a flexible LED vehicle-mounted display screen according to claim 1, wherein the MCU and the drive IC are wrapped with a ground network.

* * * * *